(12) United States Patent
Hung et al.

(10) Patent No.: US 9,978,718 B2
(45) Date of Patent: May 22, 2018

(54) LIGHT-EMITTING DEVICE AND BACKLIGHT MODULE USING THE SAME

(71) Applicant: Genesis Photonics Inc., Tainan (TW)

(72) Inventors: Cheng-Wei Hung, Tainan (TW); Yu-Feng Lin, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 0 days. days.

(21) Appl. No.: 15/073,705

(22) Filed: Mar. 18, 2016

(65) Prior Publication Data
US 2016/0276293 A1    Sep. 22, 2016

Related U.S. Application Data

(60) Provisional application No. 62/134,577, filed on Mar. 18, 2015.

(51) Int. Cl.
| | |
|---|---|
| *H01L 33/08* | (2010.01) |
| *H01L 25/065* | (2006.01) |
| *H01L 33/60* | (2010.01) |
| *H01L 33/52* | (2010.01) |
| *H01L 23/00* | (2006.01) |

(Continued)

(52) U.S. Cl.
CPC ........ *H01L 25/0655* (2013.01); *H01L 23/562* (2013.01); *H01L 23/60* (2013.01); *H01L 27/15* (2013.01); *H01L 29/866* (2013.01); *H01L 33/08* (2013.01); *H01L 33/10* (2013.01); *H01L 33/48* (2013.01); *H01L 33/486* (2013.01); *H01L 33/50* (2013.01); *H01L 33/502* (2013.01); *H01L 33/52* (2013.01); *H01L 33/60* (2013.01); *H01L 33/642* (2013.01); *H01L 33/647* (2013.01); *H01L 25/0753* (2013.01); *H01L 33/508* (2013.01); *H01L 33/56* (2013.01); *H01L 2224/16225* (2013.01); *H01L 2224/48091* (2013.01); *H01L 2224/49107* (2013.01); *H01L 2924/18161* (2013.01); *H01L 2933/0025* (2013.01); *H01L 2933/0033* (2013.01); *H01L 2933/0041* (2013.01); *H01L 2933/0058* (2013.01)

(58) Field of Classification Search
CPC ......... H01L 33/08; H01L 33/50; H01L 33/52; H01L 33/62
See application file for complete search history.

(56) References Cited

U.S. PATENT DOCUMENTS

| | | | |
|---|---|---|---|
| 2009/0155937 A1* | 6/2009 | Tsou ...................... | H01L 33/486 438/26 |
| 2011/0012153 A1* | 1/2011 | Kim ...................... | H01L 33/486 257/98 |

(Continued)

*Primary Examiner* — Phat X Cao
(74) *Attorney, Agent, or Firm* — McClure, Qualey & Rodack, LLP

(57) ABSTRACT

A light-emitting device is provided. The light-emitting device includes a substrate having a long edge and a short edge, at least one electrode pad assembly, and at least one light-emitting element. The at least one electrode pad assembly is disposed on the substrate and includes a first electrode pad and a second electrode pad. The at least one light-emitting element has a plurality of electrodes electrically connected to the first electrode pad and the second electrode pad of the at least one electrode pad assembly. The first electrode pad and the second electrode pad are arranged along a direction parallel to the short side.

20 Claims, 3 Drawing Sheets

(51) Int. Cl.
*H01L 33/10* (2010.01)
*H01L 33/50* (2010.01)
*H01L 23/60* (2006.01)
*H01L 29/866* (2006.01)
*H01L 33/48* (2010.01)
*H01L 27/15* (2006.01)
*H01L 33/64* (2010.01)
H01L 25/075 (2006.01)
H01L 33/56 (2010.01)

(56) References Cited

U.S. PATENT DOCUMENTS

| | | | | |
|---|---|---|---|---|
| 2011/0090422 A1* | 4/2011 | Hamada | ............... | G02B 6/0085 |
| | | | | 349/62 |
| 2013/0050982 A1* | 2/2013 | Phang | .................. | H01L 33/507 |
| | | | | 362/84 |
| 2013/0187174 A1* | 7/2013 | Tischler | ................. | H01L 33/50 |
| | | | | 257/80 |
| 2014/0021506 A1* | 1/2014 | Yamada | ................. | H01L 33/52 |
| | | | | 257/99 |
| 2014/0124812 A1* | 5/2014 | Kuramoto | ............... | H01L 33/54 |
| | | | | 257/98 |
| 2015/0236224 A1* | 8/2015 | Kwak | ................. | G02B 6/0023 |
| | | | | 362/612 |

* cited by examiner

LIGHT-EMITTING DEVICE AND BACKLIGHT MODULE USING THE SAME

This application claims the benefit of U.S. Provisional application Ser. No. 62/134,577, filed Mar. 18, 2015, the present disclosure of which is incorporated by reference herein in its entirety.

TECHNICAL FIELD

The disclosure relates in general to a light-emitting device and a backlight module using the same, and more particularly to a light-emitting device having different electrode directions and a backlight module using the same.

BACKGROUND

Generally speaking, the light-emitting element can be disposed on a substrate to form a light-emitting device using flip-chip technology. Typically, the substrate can be realized by a rectangular substrate having a long side and a short side. However, when there is a large size difference between the long side and the short side, the substrate is easily warped, causing damage to the light-emitting elements disposed on the substrate.

Therefore, it has become a prominent task for the industries to provide a light-emitting device capable of resolving the above problems.

SUMMARY

The present disclosure is directed to a light-emitting device and a backlight module using the same. By changing the arrangement of electrode pads on the substrate, the strength of the light-emitting elements bonded to the substrate can be effectively enhanced to avoid the light-emitting elements being peeled off from the substrate.

According to one embodiment of the present disclosure, a light-emitting device is provided. The light-emitting device includes a substrate, at least one electrode pad assembly and at least one light-emitting element. The substrate has a long side and a short side. The electrode pad assembly is disposed on the substrate, and includes a first electrode pad and a second electrode pad. The light-emitting element has a plurality of electrodes electrically connected to the first electrode pad and the second electrode pad of the at least one electrode pad assembly. The first electrode pad and the second electrode pad are arranged along a direction parallel to the short side.

According to another embodiment of the present disclosure, a backlight module is provided. The backlight module includes a light guide plate, a light-emitting device and at least one reflective element. The light guide plate has a light-incoming surface and a light-outgoing surface adjacent to the light-incoming surface. The light-emitting device faces the light-incoming surface, and includes a substrate, at least one electrode pad assembly and at least one light-emitting element. The electrode pad assembly is disposed on the substrate, and includes a first electrode pad and a second electrode pad. The light-emitting element has a plurality of electrodes electrically connected to the first electrode pad and the second electrode pad of at least one electrode pad assembly. The reflective element reflects lights emitted from the light-emitting device. The first electrode pad and the second electrode pad are arranged along a direction perpendicular to the light-outgoing surface.

The above and other aspects of the present disclosure will become better understood with regard to the following detailed description of the preferred but non-limiting embodiment (s). The following description is made with reference to the accompanying drawings.

DETAILED DESCRIPTION

Figure 1:
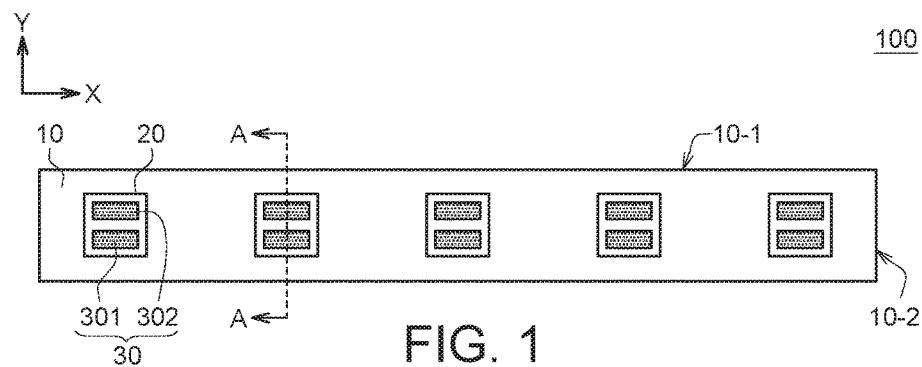
FIG. 1 is a top view of a light-emitting device according to an embodiment of the present disclosure.

A number of embodiments of the present disclosure are disclosed below with reference to accompanying drawings. However, the structure and content disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the present disclosure will be able to make suitable modifications or changes based on the specification disclosed below to meet actual needs without breaching the spirit of the present disclosure. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

Figure 2A:
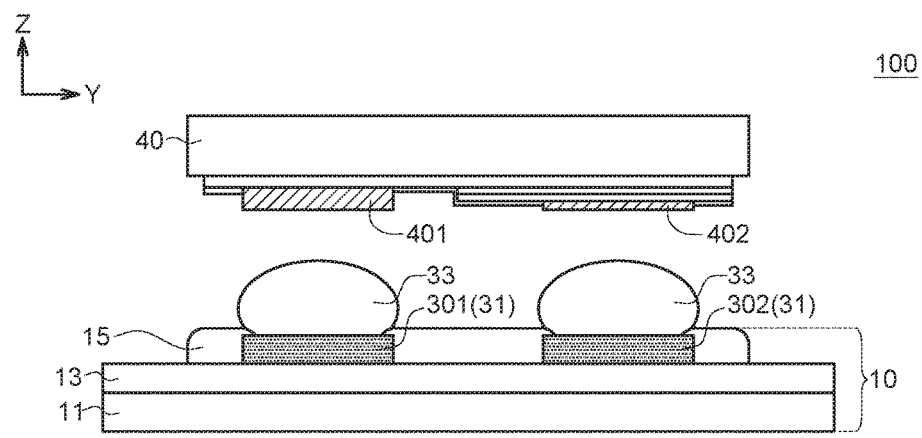
FIGS. 2A and 2B are cross-sectional views of a light-emitting device along a line segment A-A' of FIG. 1 according to an embodiment of the present disclosure.
Figure 2B:
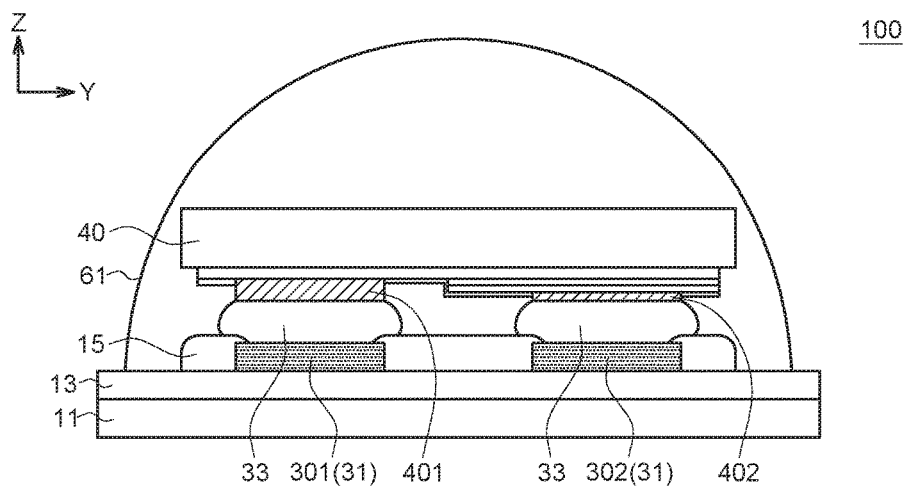

FIG. 1 is a top view of a light-emitting device 100 according to an embodiment of the present disclosure. FIGS. 2A and 2B are cross-sectional views of a light-emitting device 100 along a line segment A-A' of FIG. 1 according to an embodiment of the present disclosure. FIG. 2A is a schematic diagram of a substrate 10 and a light-emitting element 40 having not been combined together. FIG. 2B is a schematic diagram of a substrate 10 and a light-emitting element 40 having been combined together. It should be noted that some elements (such as the light-emitting element 40) are omitted in FIG. 1 so that the relationship between the elements disposed on the substrate 10 can be more clearly illustrated.

As indicated in FIGS. 1, 2A, 2B, the light-emitting device 100 of the present disclosure embodiment includes a substrate 10, at least one electrode pad assembly 30 and at least one light-emitting element 40. In the present embodiment, the electrode pad assembly 30 is disposed on the substrate 10. For example, the electrode pad assembly 30 may be disposed at a predetermined position 20 corresponding to the light-emitting element 40. The electrode pad assembly 30 may include a first electrode pad 301 and a second electrode pad 302.

It should be noted that although the light-emitting device 100 illustrated in FIG. 1 includes 5 electrode pad assemblies 30, the present disclosure is not limited thereto. The quantity of electrode pad assemblies 30 of the light-emitting device 100 may be adjusted to fit design needs.

The light-emitting element 40, which can be realized by such as a light-emitting diode (LED), has a plurality of electrodes 401 and 402 electrically connected to the first electrode pad 301 and the second electrode pad 302 of the electrode pad assembly 30. As indicated in FIG. 2A, the part between the electrode 401 of the light-emitting element 40 and the first electrode pad 301 of the electrode pad assembly 30 and the part between the electrode 402 of the light-emitting element 40 and the second electrode pad 302 of electrode pad assembly 30 may further include a solder paste 33.

In the present embodiment, the substrate 10 has a long side 10-1 and a short side 10-2, and the first electrode pad 301 and the second electrode pad 302 of the electrode pad assembly 30 are arranged along a direction parallel to the short side 10-2. That is, the substrate 10 has a plurality of electrodes (at least two) along the direction parallel to the short side 10-2.

For example, the substrate 10 may have a rectangular shape, the long side 10-1 is parallel to the X-axis of FIG. 1, and the short side 10-2 is parallel to the Y-axis of FIG. 1. That is, the long side 10-1 is perpendicular to the short side 10-2, and the first electrode pad 301 and the second electrode pad 302 of the electrode pad assembly 30 are arranged along the direction parallel to the Y-axis of FIG. 1.

In an embodiment, each of the first electrode pad 301 and the second electrode pad 302 has a rectangular shape. That is, each of the first electrode pad 301 and the second electrode pad 302 has a long side and a short side. As indicated in FIG. 1, the long side of the first electrode pad 301 and the long side of the second electrode pad 302 are parallel to the long side 10-1 of the substrate 10, and the short side of the first electrode pad 301 and the short side of the second electrode pad 302 is parallel to the short side 10-2 of the substrate 10. However, the present disclosure is not limited thereto. The first electrode pad 301 and the second electrode pad 302 may have other shapes. For example, each of the first electrode pad 301 and the second electrode pad 302 has a squared shape.

In an embodiment, the substrate 10 is a printed circuit board (PCB), such as an aluminum substrate including an aluminum base layer 11, an insulation layer 13, a plurality of copper-containing metal layers 31 and a solder resist layer 15. The insulation layer 13 is disposed on the aluminum base layer 11. The copper-containing metal layers 31 are disposed on the insulation layer 13, and correspond to the positions of the first electrode pad 301 and the second electrode pad 302 of the electrode pad assembly 30. The solder resist layer 15 is interposed between the copper-containing metal layers 31.

However, the present disclosure is not limited thereto, and the substrate 10 of the light-emitting device 100 may be formed of other materials. For example, the substrate 10 may be formed of CEM-3 or FR-4.

As indicated in FIG. 2B, the solder paste 33 may connect the electrodes 401 and 402 of the light-emitting element 40 with the first electrode pad 301 and the second electrode pad 302 of the electrode pad assembly 30 to combine the substrate 10 with the light-emitting element 40. In the present embodiment, the light-emitting device 100 may further include a sealing structure 61, which covers the light-emitting element 40 after the substrate 10 and the light-emitting element 40 are combined together. In some embodiments, the sealing structure 61 may include a number of phosphor particles, such that the lights emitted from the light-emitting element 40 may have different colors.

Figure 3A:
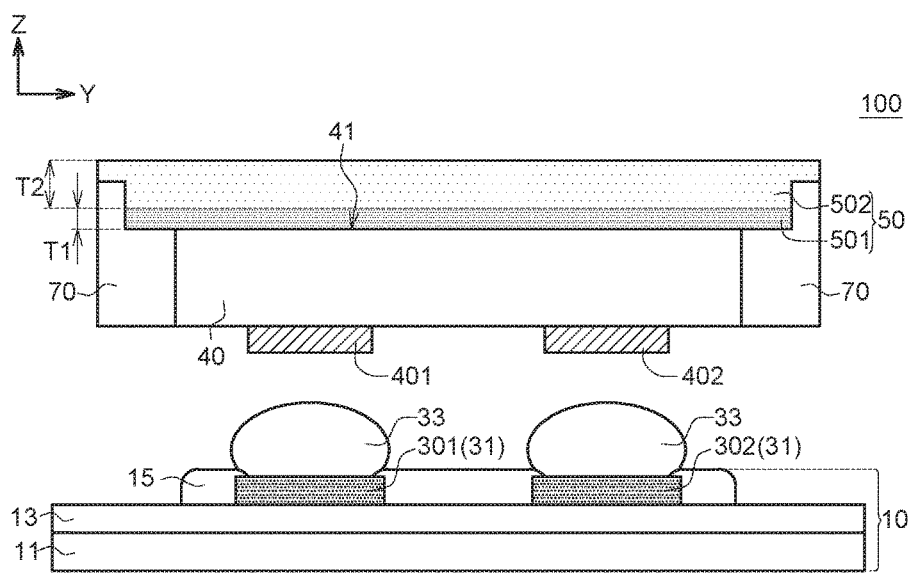
FIGS. 3A and 3B are cross-sectional views of a light-emitting device along a line segment A-A' of FIG. 1 according to another embodiment of the present disclosure.
Figure 3B:
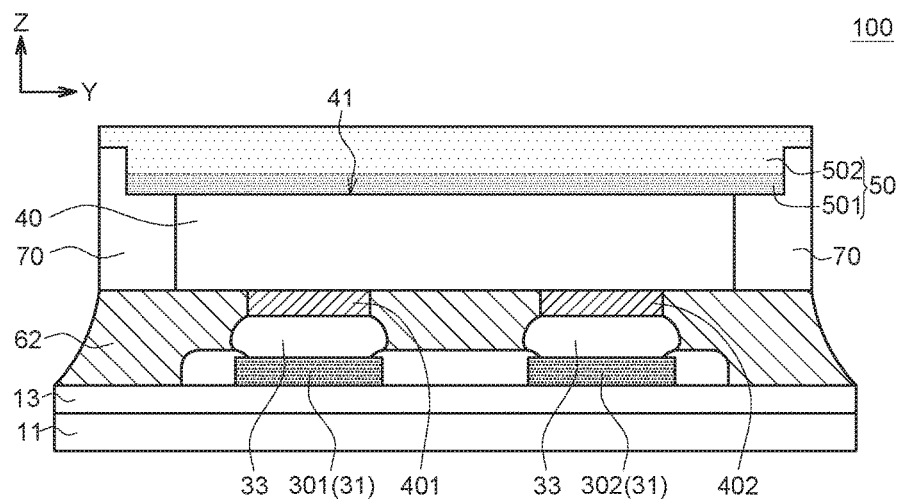

In the present embodiment, the light-emitting device 100 is not limited to the structure illustrated in FIGS. 2A and 2B. FIGS. 3A and 3B are cross-sectional views of a light-emitting device 100 along a line segment A-A' of FIG. 1 according to another embodiment of the present disclosure. FIG. 3A is a schematic diagram of a substrate 10 and a light-emitting element 40 having not been combined together. FIG. 3B is a schematic diagram of a substrate 10 and a light-emitting element 40 having been combined together.

In the present embodiment, the light-emitting device 100 includes a wavelength conversion layer 50, which may be disposed on the light-emitting element 40. The wavelength conversion layer 50 includes a number of phosphor particles. In some embodiments as indicated in FIGS. 3A and 3B, the wavelength conversion layer 50 may include a high-density conversion layer 501 and a low-density conversion layer 502, wherein the area having a higher density of phosphor particles is defined as the high-density conversion layer 501, and the area having a lower density of phosphor particles is defined as the low-density conversion layer 502. In an embodiment, the ratio of density of phosphor particles of the high-density conversion layer 501 to the density of phosphor particles of the low-density conversion layer 502 may range between 1 and $10^{15}$. In other embodiments of the present disclosure, the low-density conversion layer 502 of the wavelength conversion layer 50 may be a transparent layer without any phosphor particles. In one embodiment of the present disclosure, the high-density conversion layer 501 and the low-density conversion layer 502 may be formed concurrently or separately.

In the present embodiment, the high-density conversion layer 501 is interposed between the light-emitting element 40 and the low-density conversion layer 502. That is, the lights emitted from the light-emitting element 40 firstly pass through the high-density conversion layer 501 and then exit via the low-density conversion layer 502. The design of the high-density conversion layer 501 allows the light color of the lights emitted from several light-emitting devices 100 to have a centralized distribution on the chromaticity coordinates, such that the product yield of the light-emitting devices 100 may be increased. The low-density conversion layer 502 enables the lights emitted from the light-emitting element 40 to have a larger probability to be mixed.

In the present embodiment, the thickness T2 of the low-density conversion layer 502 is larger than the thickness T1 of the high-density conversion layer 501. For example, the ratio of the thickness T2 of the low-density conversion layer 502 to the thickness T1 of the high-density conversion layer 501 may range between 1 and 100.

In the present embodiment, the wavelength conversion layer 50 may cover the entire top surface 41 of the light-emitting element 40. That is, the top view area of the wavelength conversion layer 50 is larger than the top view area of the light-emitting element 40. For example, the ratio of the top view area of the wavelength conversion layer 50 to the top view area of the light-emitting element 40 may range between 1 and 1.35, but the present disclosure is not limited thereto. In some embodiments, the ratio of the top view area of the wavelength conversion layer 50 to the top view area of the light-emitting element 40 may be larger than 1.35.

In an embodiment, the wavelength conversion layer 50 may be formed of sulfide, yttrium aluminum garnet (YAG), LuAG, silicate, nitride, oxynitride, fluoride, TAG, KSF, and KTF.

Besides, the light-emitting device 100 of the present embodiment may further include a reflective structure 70, which may cover a lateral side of the light-emitting element 40 and a part of the wavelength conversion layer 50 to effectively protect and avoid the light-emitting element 40 and the wavelength conversion layer 50 from being exposed and damaged. The reflective structure 70, realized by such as white glue, may reflect the lights emitted from the lateral side of the light-emitting element 40 to the wavelength conversion layer 50 to increase the luminous efficiency of the light-emitting device 100.

In an embodiment, the reflectivity of the reflective structure 70 may be higher than 90%. The reflective structure 70 may be formed of poly phthalic amide (PPA), polyamide (PA), polyethylene terephthalate (PTT), polyethylene terephthalate (PET), polyethylene terephthalate 1,4-cyclohexane dimethylene terephthalate (PCT), epoxy compound (EMC), silicone compound (SMC) or other resin/ceramics having a high reflectivity.

Similarly, as indicated in FIG. 3B, the solder paste 33 may connect the electrodes 401 and 402 of the light-emitting element 40 with the first electrode pad 301 and the second electrode pad 302 of the electrode pad assembly 30 to combine the substrate 10 with the light-emitting element 40. In the present embodiment, the light-emitting device 100 may further include a filling structure 62 infused between the substrate 10 and the light-emitting element 40 after the substrate 10 and the light-emitting element 40 are combined together.

As disclosed in above embodiments, the first electrode pad 301 and the second electrode pad 302 of the electrode pad assembly 30 are arranged along the direction parallel to the short side 10-2, such that the strength of the light-emitting element 40 on the substrate 10 may be increased. Although the large size difference between the long side 10-1 and the short side 10-2 may cause warpage to the substrate 10, the light-emitting element 40 would not be damaged easily.

Figure 4:
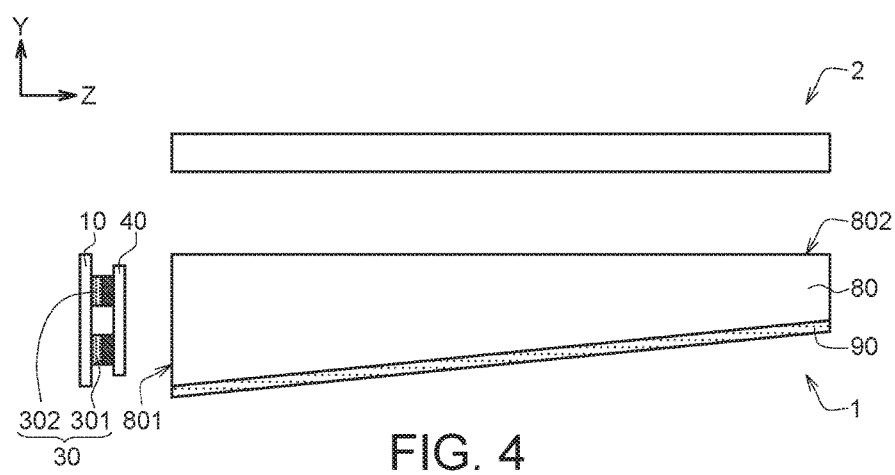
FIG. 4 is a schematic diagram of a backlight module according to an embodiment of the present disclosure.

Furthermore, the light-emitting device 100 of the present disclosure may be used in a backlight module to form an edge type backlight module. FIG. 4 is a schematic diagram of a backlight module 1 according to an embodiment of the present disclosure. As indicated in FIG. 4, the backlight module 1 may include a light guide plate 80, a light-emitting device and at least one reflective element 90. The backlight module 1 may be disposed on one side of the display panel 2.

The light guide plate 80 has a light-incoming surface 801 and a light-outgoing surface 802 adjacent to the light-incoming surface 801. The light-emitting device faces the light-incoming surface 801 of the light guide plate 80. The reflective element 90 reflects the lights emitted from the light-emitting device.

The light-emitting device may be realized by such as the light-emitting device 100 illustrated in FIGS. 1, 2B and 3B. That is, the light-emitting device may include a substrate 10, at least one electrode pad assembly 30 and at least one light-emitting element 40. The electrode pad assembly 30 is disposed on the substrate 10, and includes a first electrode pad 301 and a second electrode pad 302. The light-emitting element 40 has a plurality of electrodes connected to the first electrode pad 301 and the second electrode pad 302 of the electrode pad assembly 30.

In an embodiment, the reflective element 90 is disposed at the bottom of the light guide plate 80. When the lights enter the light guide plate 80 from the light-emitting element 40 of the light-emitting device via the light-incoming surface 801 of the light guide plate 80, the reflective element 90 would then reflect the lights to the light-outgoing surface 802 of the light guide plate 80. The reflective element 90 may be realized by such as a reflective plate, but the present disclosure is not limited thereto, and any reflective element capable of reflecting the lights emitted from the light-emitting element 40 of the light-emitting device may be used in the backlight module 1 of the present disclosure.

In the present embodiment, the first electrode pad 301 and the second electrode pad 302 of the electrode pad assembly 30 are arranged along a direction perpendicular to the light-outgoing surface 802. That is, the backlight module 1 has a number of electrode pads (at least two) along the direction perpendicular to the light-outgoing surface 802. For example, the first electrode pad 301 and the second electrode pad 302 may be arranged along a direction parallel to the Y-axis of FIG. 4.

Similarly, the substrate 10 may be realized by such as a rectangular substrate having a long side and a short side. FIG. 4 only shows the short side of the substrate 10 (parallel to the Y-axis). The first electrode pad 301 and the second electrode pad 302 of the electrode pad assembly 30 are arranged along a direction parallel to the short side of the substrate 10.

In an embodiment, each of the first electrode pad 301 and the second electrode pad 302 may be realized by a rectangular electrode. That is, each of the first electrode pad 301 and the second electrode pad 302 has a long side and a short side. The long side of the first electrode pad 301 and the long side of the second electrode pad 302 may be parallel to the long side of the substrate 10, and the short side of the first electrode pad 301 and the short side of the second electrode pad 302 may be parallel to the short side of the substrate 10.

Due to the design of the first electrode pad 301 and the second electrode pad 302 of the electrode pad assembly 30 being arranged along the direction perpendicular to the light-outgoing surface 802, the strength of the light-emitting element 40 on the substrate 10 may be increased, such that the light-emitting element 40 would not be easily peeled off the substrate 10.

It will be apparent to those skilled in the art that various modifications and variations can be made to the disclosed embodiments. It is intended that the specification and examples be considered as exemplary only, with a true scope of the present disclosure being indicated by the following claims and their equivalents.

What is claimed is:

1. A light-emitting device, comprising:
 a substrate having a long side and a short side;
 at least one electrode pad assembly disposed on the substrate, wherein the at least one electrode pad assembly comprises a first electrode pad and a second electrode pad;
 at least one light-emitting element flipped on the substrate and having a light emitting diode and a plurality of electrodes electrically connected to the first electrode pad and the second electrode pad of the at least one electrode pad assembly;
 a white reflective layer attached to a side surface of the light emitting diode and exposed the electrodes and a top surface of the light emitting diode; and
 a phosphor layer at least disposed on the top surface of the light emitting diode;
 wherein the first electrode pad and the second electrode pad are arranged along a direction parallel to the short side and the white reflective layer has a flat lateral surface, and a bottom surface of the white reflective layer is higher than bottom surfaces of the electrodes.

2. The light-emitting device according to claim 1, wherein each of the first electrode pad and the second electrode pad has a long side and a short side, the long side of the first electrode pad and the long side of the second electrode pad are parallel to the long side of the substrate, and the short side of the first electrode pad and the short side of the second electrode pad are parallel to the short side of the substrate.

3. The light-emitting device according to claim 1, wherein the substrate comprises:
   an metal base layer;
   an insulation layer disposed on the metal base layer;
   a plurality of metal layers disposed on the insulation layer; and
   a solder resist layer interposed between the copper-containing metal layers;
   wherein the metal layers form the first electrode pad and the second electrode pad.

4. The light-emitting device according to claim 1, wherein the bottom surface of the white reflective layer is not lower than a bottom surface of the light emitting diode.

5. The light-emitting device according to claim 1, further comprising:
   a dome-shaped sealing structure covering the at least one light-emitting element.

6. The light-emitting device according to claim 1, wherein the phosphor layer is disposed on the white reflective layer and has a flat lateral surface flush with the flat lateral surface of the white reflective layer.

7. The light-emitting device according to claim 1, wherein the phosphor layer comprises a high-density conversion layer and a low-density conversion layer, and the high-density conversion layer is interposed between the light-emitting diode and the low-density conversion layer.

8. The light-emitting device according to claim 7, wherein a ratio of a thickness of the low-density conversion layer to a thickness of the high-density conversion layer is between 1 and 100.

9. The light-emitting device according to claim 1, further comprising:
   a filling structure infused between the substrate and the at least one light-emitting element.

10. The light-emitting device according to claim 1, further comprising a light transmissive layer disposed on the phosphor layer.

11. A backlight module, comprising:
    a light guide plate having a light-incoming surface and a light-outgoing surface adjacent to the light-incoming surface;
    a light-emitting device facing the light-incoming surface and comprising:
      a substrate;
      at least one electrode pad assembly disposed on the substrate, wherein the at least one electrode pad assembly comprises a first electrode pad and a second electrode pad;
      at least one light-emitting element flipped on the substrate and having a light emitting diode and a plurality of electrodes connected to the first electrode pad and the second electrode pad of the at least one electrode pad assembly;
      a white reflective layer attached to a side surface of the light emitting diode and exposed the electrodes and a top surface of the light emitting diode, wherein the white reflective layer has a flat lateral surface, and a bottom surface of the white reflective layer is higher than bottom surfaces of the electrodes; and
      a phosphor layer at least disposed on the top surface of the light emitting diode; and
    at least one reflective element attached to a side surface of the light guide plate opposite to the light-outgoing surface and reflecting lights emitted from the light-emitting device;
    wherein the first electrode pad and the second electrode pad are arranged along a direction perpendicular to the light-outgoing surface.

12. The backlight module according to claim 11, wherein the substrate has a long side and a short side, and the first electrode pad and the second electrode pad are arranged along a direction parallel to the short side.

13. The backlight module according to claim 12, wherein each of the first electrode pad and the second electrode pad has a long side and a short side, the long side of the first electrode pad and the long side of the second electrode pad are parallel to the long side of the substrate, and the short side of the first electrode pad and the short side of the second electrode pad are parallel to the short side of the substrate.

14. The backlight module according to claim 11, wherein the substrate comprises:
    an metal base layer;
    an insulation layer disposed on the metal base layer;
    a plurality of metal layers disposed on the insulation layer; and
    a solder resist layer interposed between the metal layers;
    wherein the metal layers form the first electrode pad and the second electrode pad.

15. The backlight module according to claim 11, wherein the bottom surface of the white reflective layer is not lower than a bottom surface of the light emitting diode.

16. The backlight module according to claim 11, wherein the light-emitting device further comprises:
    a dome-shaped sealing structure covering the at least one light-emitting element.

17. The backlight module according to claim 11, wherein the phosphor layer is disposed on the white reflective layer and has a flat lateral surface flush with the flat lateral surface of the white reflective layer.

18. The backlight module according to claim 17, wherein the phosphor layer comprises a high-density conversion layer and a low-density conversion layer, and the high-density conversion layer is interposed between the at least one light-emitting element and the low-density conversion layer.

19. The backlight module according to claim 11, wherein the light-emitting device further comprises:
    a filling structure infused between the substrate and the at least one light-emitting element.

20. The backlight module according to claim 11, wherein the light-emitting device further comprises a light transmissive layer disposed on the phosphor layer.

* * * * *